(12) United States Patent
Johnson et al.

(10) Patent No.: US 7,023,273 B2
(45) Date of Patent: Apr. 4, 2006

(54) ARCHITECTURE AND IMPLEMENTATION METHODS OF DIGITAL PREDISTORTION CIRCUITRY

(75) Inventors: Robert Everest Johnson, Randolph, NJ (US); Sridhar Arunachalam, Plainsboro, NJ (US)

(73) Assignee: Andrew Corporation, Orland Park, IL (US)

( * ) Notice: Subject to any disclaimer, the term of this patent is extended or adjusted under 35 U.S.C. 154(b) by 149 days.

(21) Appl. No.: 10/679,873

(22) Filed: Oct. 6, 2003

(65) Prior Publication Data

US 2005/0073360 A1    Apr. 7, 2005

(51) Int. Cl.
*H03F 1/26* (2006.01)
(52) U.S. Cl. ...................... 330/149; 375/297
(58) Field of Classification Search ............ 330/149, 330/129, 136; 375/297; 455/63
See application file for complete search history.

(56) References Cited

U.S. PATENT DOCUMENTS

| | | | |
|---|---|---|---|
| 3,241,078 A | 3/1966 | Jones | 329/50 |
| 3,689,752 A | 9/1972 | Gilbert | 235/194 |
| 4,156,283 A | 5/1979 | Gilbert | 364/841 |
| 4,879,519 A | 11/1989 | Myer | 330/149 |
| 4,978,873 A | 12/1990 | Shoemaker | 307/498 |
| 5,023,565 A | 6/1991 | Lieu | 330/151 |
| 5,049,832 A | 9/1991 | Carvers | 330/149 |
| 5,115,409 A | 5/1992 | Stepp | 364/841 |
| 5,119,040 A | 6/1992 | Long et al. | 330/149 |
| 5,130,663 A | 7/1992 | Tattersall, Jr. | 330/52 |
| 5,323,119 A | 6/1994 | Powell et al. | 330/151 |
| 5,325,095 A | 6/1994 | Vadnais et al. | 342/22 |
| 5,414,383 A | 5/1995 | Cusdin et al. | 329/304 |
| 5,420,536 A | 5/1995 | Faulkner et al. | 330/149 |
| 5,477,187 A | 12/1995 | Kobayashi et al. | 330/52 |
| 5,485,120 A | 1/1996 | Anvari | 330/151 |
| 5,491,454 A | 2/1996 | Matz | 330/149 |
| 5,528,196 A | 6/1996 | Baskin et al. | 330/151 |
| 5,594,385 A | 1/1997 | Anvari | 330/149 |
| 5,610,554 A | 3/1997 | Anvari | 330/52 |
| 5,617,061 A | 4/1997 | Fukuchi | 330/151 |
| 5,621,354 A | 4/1997 | Mitzlaff | 330/52 |
| 5,691,668 A | 11/1997 | Yoshikawa et al. | 330/151 |
| 5,732,333 A | 3/1998 | Cox et al. | 455/126 |
| 5,740,520 A | 4/1998 | Cyze et al. | 455/69 |

(Continued)

FOREIGN PATENT DOCUMENTS

EP         0 367 457 B1    3/1996

(Continued)

OTHER PUBLICATIONS

Lohtia, Anit et al., "Power Amplifier Linearization using Cubic Spline Interpolation", *IEEE*, (1993), No. 0-7803-1266-x/93, pp. 676-679.

(Continued)

*Primary Examiner*—Henry Choe
(74) *Attorney, Agent, or Firm*—Wood, Herron & Evans, L.L.P.

(57) ABSTRACT

A predistorter including a modulator configured for use with an RF power amplifier or in an amplifier system that combines in a data structure correction factors for amplitude and phase non-linearities in the responses of the amplifier and the modulator. Correction factors for memory effects in the response of the RF power amplifier may also be calculated within the data structure from scale factors transferred into the data structure. Such a calculation may be based on a scaled polynomial. A circuit for applying the difference equation to the correction factors may also be included.

50 Claims, 3 Drawing Sheets

U.S. PATENT DOCUMENTS

| | | | |
|---|---|---|---|
| 5,760,646 A | 6/1998 | Belcher et al. | 330/149 |
| 5,808,512 A | 9/1998 | Bainvoll et al. | 330/151 |
| 5,818,298 A | 10/1998 | Dent et al. | 335/10 |
| 5,831,478 A | 11/1998 | Long | 330/52 |
| 5,862,459 A | 1/1999 | Charas | 455/114 |
| 5,867,065 A | 2/1999 | Leyendecker | 330/149 |
| 5,877,653 A | 3/1999 | Kim et al. | 330/149 |
| 5,880,633 A | 3/1999 | Leizerovich et al. | 330/84 |
| 5,892,397 A | 4/1999 | Belcher et al. | 330/149 |
| 5,898,338 A | 4/1999 | Proctor et al. | 330/149 |
| 5,900,778 A | 5/1999 | Stonick et al. | 330/149 |
| 5,912,586 A | 6/1999 | Mitzlaff | 330/149 |
| 5,923,214 A | 7/1999 | Mitzlaff | 330/52 |
| 5,929,703 A | 7/1999 | Sehier et al. | 330/149 |
| 5,933,766 A | 8/1999 | Dent | 445/103 |
| 5,949,283 A | 9/1999 | Proctor et al. | 330/149 |
| 5,959,499 A | 9/1999 | Khan et al. | 330/149 |
| 5,977,826 A | 11/1999 | Behan et al. | 330/151 |
| 5,986,499 A | 11/1999 | Myer | 330/52 |
| 6,046,635 A | 4/2000 | Gentzler | 330/149 |
| 6,052,023 A | 4/2000 | Myer | 330/2 |
| 6,072,364 A * | 6/2000 | Jeckeln et al. | 330/149 |
| 6,091,295 A | 7/2000 | Zhang | 330/149 |
| 6,091,715 A | 7/2000 | Vucetic et al. | 370/277 |
| 6,104,239 A | 8/2000 | Jenkins | 330/2 |
| 6,118,335 A | 9/2000 | Nielsen et al. | 330/2 |
| 6,118,339 A | 9/2000 | Gentzler et al. | 330/149 |
| 6,125,266 A | 9/2000 | Matero et al. | 445/126 |
| 6,137,335 A | 10/2000 | Proebsting | 327/281 |
| 6,141,390 A | 10/2000 | Cova | 375/297 |
| 6,144,255 A | 11/2000 | Patel et al. | 330/151 |
| 6,148,185 A | 11/2000 | Maruyama et al. | 455/115 |
| 6,154,641 A | 11/2000 | Zhang | 455/112 |
| 6,157,253 A | 12/2000 | Sigmon et al. | 330/10 |
| 6,166,601 A | 12/2000 | Shalom et al. | 330/151 |
| 6,172,564 B1 | 1/2001 | Rzyski | 330/149 |
| 6,208,846 B1 | 3/2001 | Chen et al. | 455/127 |
| 6,211,733 B1 | 4/2001 | Gentzler | 330/149 |
| 6,236,267 B1 | 5/2001 | Anzil | 330/149 |
| 6,236,837 B1 | 5/2001 | Midya | 455/63 |
| 6,246,286 B1 * | 6/2001 | Persson | 330/149 |
| 6,275,685 B1 * | 8/2001 | Wessel et al. | 455/126 |
| 6,285,251 B1 | 9/2001 | Dent et al. | 330/127 |
| 6,285,255 B1 | 9/2001 | Luu et al. | 330/149 |
| 6,304,140 B1 | 10/2001 | Thron et al. | 330/149 |
| 6,337,599 B1 | 1/2002 | Lee | 330/149 |
| 6,342,810 B1 | 1/2002 | Wright et al. | 330/51 |
| 6,353,360 B1 | 3/2002 | Hau et al. | 330/149 |
| 6,356,146 B1 | 3/2002 | Wright et al. | 330/2 |
| 6,359,508 B1 | 3/2002 | Mucenieks | 330/149 |
| 6,377,785 B1 | 4/2002 | Ogino | 455/127 |
| 6,388,513 B1 * | 5/2002 | Wright et al. | 330/2 |
| 6,388,518 B1 | 5/2002 | Miyatani | 330/149 |
| 6,414,545 B1 | 7/2002 | Zhang | 330/149 |
| 6,462,617 B1 * | 10/2002 | Kim | 330/2 |
| 6,496,064 B1 | 12/2002 | Rzyski | 330/149 |
| 6,512,417 B1 | 1/2003 | Booth et al. | 330/149 |
| 6,535,066 B1 | 3/2003 | Petsko | 330/285 |
| 2003/0058959 A1 | 3/2003 | Rafie et al. | |
| 2003/0146787 A1 | 8/2003 | Hedberg et al. | |

FOREIGN PATENT DOCUMENTS

| | | |
|---|---|---|
| EP | 0 998 026 A1 | 5/2000 |
| EP | 1 162 732 A3 | 12/2001 |
| EP | 0 948 131 B1 | 3/2002 |
| GB | 2 400 509 | 10/2004 |
| WO | WO 97/08822 | 3/1997 |
| WO | WO 02/095932 | 11/2002 |

OTHER PUBLICATIONS

Stapleton, Shawn P., "Amplifier Linearization Using Adaptive Digital Predistortion—The need for greater linearity can be addressed at the digital coding level", *Applied Microwave & Wireless*, Technical Feature, (Feb. 2001), pp. 72-77.

Vella-Coleiro, George, *Frequency-Dependent Phase Pre-Distortion for Reducing Spurious Emissions in Communication Networks*, U.S. Appl. No. 10/068,343, filed on Feb. 5, 2002.

British Search Report, Nov. 29, 2004.

White, Paul E. et al., *Digital Baseband Receiver in a Multi-carrier Power Amplifier*, U.S. Appl. No. 10/091,756, filed on Mar. 6, 2002.

DeBruyn, William P. et al., *An Uncorrelated Adaptive Predistorter*, U.S. Appl. No. 10/342,633, filed on Jan. 15, 2003.

Leffel, Michael D., *Independence Between Paths That Predistort for Memory and Memory-less Distortion in Power Amplifiers*, U.S. Appl. No. 10/406,959, filed on Apr. 3, 2003.

Bachman, II et al., *Elimination of Peak Clipping and Improved Efficiency for RF Power Amplifiers with a Predistorter*, U.S. Appl. No. 10/625,761, filed on Jul. 23, 2003.

* cited by examiner

ARCHITECTURE AND IMPLEMENTATION METHODS OF DIGITAL PREDISTORTION CIRCUITRY

FIELD OF THE INVENTION

This invention relates generally to radio frequency (RF) power amplifiers, and more particularly to an apparatus and method for applying signal predistortion to linearize such amplifiers, and reduce adjacent channel power (ACP).

BACKGROUND OF THE INVENTION

Ideal, or theoretical, radio frequency (RF) power amplifiers act linearly, faithfully reproducing an amplified RF signal at their output without distortion. Unfortunately, in practice, physical RF power amplifiers are actually non-linear and add a certain amount of unwanted distortion to a signal, e.g., intermodulation distortion (IMD). A portion of such IMD is then realized as adjacent channel power (ACP), and potentially causes adjacent channel interference. Moreover, physical amplifiers have a finite ability to deliver gain and/or power.

RF power amplifiers are often operated and configured in such a manner so as to provide sufficient output power at the lowest possible cost. In general, the cost of an amplifier increases with its maximum output power. Therefore, to maximize the cost effectiveness of a given RF power amplifier, the amplifier is operated close to a saturation point to provide as much output power as possible. Operation of an amplifier close to saturation affords additional output power but is often at the expense of an increase in ACP thereby increasing the potential for adjacent channel interference.

Specifically, operation of an amplifier close to saturation increases the power of unwanted IMD products within the normal operating frequency range of the amplifier. These IMD products may impede the proper transmission and reception of RF signals within the normal operating frequency range of the amplifier. To address this issue, numerous techniques have been developed to reduce IMD products from an amplified signal both within and also outside the operating frequency range of an amplifier. Such techniques include predistortion, feed-forward, and linear amplification with non-linear components (LINC). Predistortion techniques are described further below.

Recent increases in the demand for wireless communications devices have led to new frequency bands to increase capacity, such as, for example, the Universal Mobile Telecommunications System (UMTS) developed by the European Telecommunications Standard Institute for delivering 3G (third generation) services. Modern transmission protocols, such as UMTS, demand high linearity to prevent RF energy in one band from spilling over and interfering with other proximate channels and/or bands. Certain modern transmission protocols also have high Peak-to-Average Power Ratio (PAR) carrier signals that make efficient linear amplifiers difficult to design for such applications.

Another issue to be addressed is that, adjacent channel interference may be compounded as a result of the close proximity of frequency bands. RF power amplifiers therefore must operate at high drive levels in order to achieve the high linearity demanded by broadband applications. Energy leakage resulting from one band spilling over into another can undesirably degrade the signal-to-noise (SNR) ratio or bit-error rate (BER) of the proximate frequency band.

In practice, it is unnecessary to completely eliminate all ACP and/or adjacent channel interference for a selected center frequency. Certain tolerable levels of ACP are acceptable. When the terms "eliminate" or "reduce" are used herein with reference to ACP, it is understood that the ACP should be suppressed below a certain tolerable level, even though it will often not be entirely eliminated.

To address the issues noted above, predistortion circuits, or, more simply, predistorters, have been developed that allow the operation of RF power amplifiers close to saturation but also with improved linearity thereby reducing ACP and the potential for adjacent channel interference. Generally, predistorters multiply an input signal by the multiplicative inverse of the distortion in the response of an amplifier. This develops a predistorted signal, which is then applied to the amplifier. When the amplifier amplifies the predistorted signal, the distortions due to non-linearities in the response of the amplifier are cancelled by the predistortions in the predistorted signal. This results in an improvement in the linearity of the amplifier, particularly when the amplifier is operated close to saturation.

While such predistorters address linearity issues, they also increase the cost of amplification, though typically less so than resorting to a higher power amplifier operated at a reduced output level. Generally, such predistorters may be either analog or digitally based, depending on the type of processing used. Moreover, predistorters will modify an RF input signal as a function of instantaneous input signal power (e.g., amplitude and phase) as well as the rate of change in the input signal power (e.g., memory effects such as self-heating, odd order distortion products, power supply compensation, etc.).

Digitally based predistorters often use look-up tables (LUTs) stored in memory to provide predistortion or correction factors to an input signal. Since some digitally based predistorters compensate based on both the instantaneous input signal envelope (input signal power) and the rate of change in the input signal envelope, a first pair of LUTs are often used for amplitude and phase correction (e.g., one for in-phase (I) and one for quadrature-phase (Q) signals) while a second pair of LUTs are used to compensate for memory effects in I and Q. Moreover, by virtue of the need to modulate an input signal onto a carrier, such predistorters often include a modulator and a third pair of LUTs containing magnitude and phase correction factors for I and Q signals, respectively, for the modulator. The use of these numerous LUTs significantly increases the memory requirements and, consequently, the cost of the predistorter and the amplifier associated therewith. Moreover, the use of multiple LUTs creates numerous other problems as well.

When multiple LUTs are used, some provision must be made for combining the correction factors from the tables. The problem of combining the correction factors is exacerbated by the application of the difference equation to the LUTs that correct for memory effects. The straightforward interpretation of the difference equation is to add to the current sample, or correction factor, the difference between the subsequent sample and the previous sample. Delay circuitry, or clocking, is typically used to apply the desired sequencing to the samples. A practical problem exists in that it is difficult to execute a fast three-operand function to meet requirements imposed by industry on many predistorters. Additionally, the use of delay circuits also increases the cost of a predistorter.

Another problem encountered in many digitally based predistorter implementations deals with the storing of correction factors in the LUTs. In calibrating digitally based predistorters with LUTs for a particular amplifier, coefficients are transmitted or loaded into the LUTs in memory.

Often, it is desirable to read back the coefficients from the LUTs to verify whether or not the coefficients were loaded or stored correctly. Such loading or reading back of correction factors requires a substantial amount of processing time and may cause a brief interruption, or glitch, in the output of the amplifier if performed while the amplifier is in use.

Yet another problem associated with LUTs deals with the number and/or size of the LUTs. Since the LUTs stored in memory may become rather large, and memory increases the cost of the predistorter, the use of multiple large LUTs to correct for instantaneous amplitude and phase and memory effects, as well as a modulator, leads to a more costly predistorter.

Existing predistorters operate in an environment where signals are modulated according to a single known modulation format. For example, RF signals may be modulated in accordance with one of any number of modulation formats which are well known in the art, including, TDMA, GSM, CDMA, WCDMA, QAM, and OFDM, to name but a few. For example, the bandwidth for a WCDMA signal is 3.84 MHz (wideband), and the bandwidth for a CDMA signal is 1.25 MHz. By contrast, a GSM signal has a bandwidth of 200 kHz, and a TDMA signal has a bandwidth of only 30 kHz (narrowband). If the signals are located in a PCS frequency band (1920 to 1980 MHz), a 60 MHz bandwidth is used. Thus, the bandwidth of a signal, depending on the modulation format and band used, may vary from 30 kHz to 3.84 MHz. As a result, the number of the LUTs may vary accordingly, since correction may be required over a greater or lesser bandwidth. Moreover, the requirements for ACP may also vary based on the modulation format utilized.

Therefore, a need exists for an IMD reduction technique that corrects for instantaneous amplitude and phase, memory effects, and a modulator having reduced memory requirements and faster processing without exhibiting glitches while at reduced cost.

BRIEF DESCRIPTION OF THE DRAWINGS

The accompanying drawings, which are incorporated in and constitute a part of this specification, illustrate embodiments of the invention and, together with the detailed description given below, serve to explain the principles of the invention.

DETAILED DESCRIPTION OF THE DRAWINGS

With reference to FIGS. 1–6, wherein like numerals denote like parts, there is shown a predistorter for use with a radio frequency (RF) power amplifier. The predistorter is configured to reduce non-linearities in the response of the RF power amplifier, thereby reducing adjacent channel power (ACP) and the potential for adjacent channel interference. More specifically, and in accordance with one aspect, the present invention combines in a data structure corrections for amplitude and phase errors in the RF power amplifier with corrections for non-linearities associated with a modulator used therein. In accordance with another aspect of the present invention, the present invention omits corrections for memory effects in a modulator used therewith. In accordance with another aspect of the present invention, a circuit is provided for applying a difference equation in compensating for memory effects in the RF power amplifier. The present invention also transfers scaling factors into a data structure, calculates correction factors using a polynomial within the data structure, and populates look-up tables with correction factors within the data structure that are then used to compensate for memory effects in an RF power amplifier. Additionally, the present invention scales the correction factors that compensate for memory effects to reduce memory size.

Figure 1:
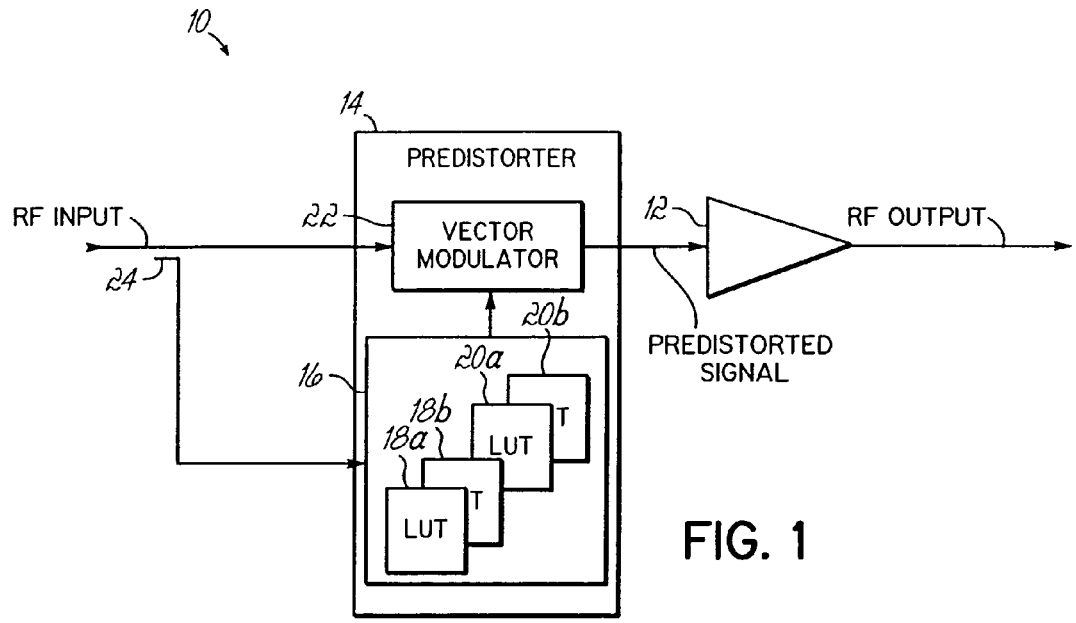
FIG. 1 is a schematic diagram of an embodiment of an amplifier system including a predistorter configured for use with a radio frequency (RF) power amplifier, and in accordance with the principles of the present invention.

Referring now to FIG. 1, there is shown one embodiment 10 of an amplifier system in accordance with the principles of the present invention. Amplifier system or amplifier 10 comprises RF power amplifier 12 and predistorter or predistortion components 14. Predistorter 14 is coupled to RF power amplifier or amplifier components 12 and is configured to receive an RF input signal (RF INPUT) and apply a correction or predistortion thereto, as indicated at PREDISTORTED SIGNAL. The RF input signal (RF INPUT) may be a data stream that is converted to comprise in-phase (I) and quadrature-phase (Q) components carried by an RF frequency, e.g., a carrier frequency, the I and Q components being orthogonally related, and ultimately used to bi-phase modulate the RF carrier. Such an RF input signal (RF INPUT), as well as the benefits of using such a signal, are well known in the art.

RF power amplifier 12 is configured to amplify the predistorted signal (PREDISTORTED SIGNAL), as indicated at RF OUTPUT, and may be coupled to an antenna (not shown) for purposes of transmitting the RF input signal (RF INPUT). RF amplifier 12 is typical of RF power amplifiers known to those of skill in the art having a non-linear response that adds a certain amount of unwanted distortion, e.g., intermodulation distortion (IMD), in amplifying a signal, a portion of such IMD being realized as ACP, and potentially causing adjacent channel interference. RF power amplifier 12 may be configured for operation using any one of a number of known modulation formats which are also well known, including, TDMA, GSM, CDMA, WCDMA, QAM, and OFDM, to name but a few. RF power amplifier 12 exhibits such non-linearities in response across its operating frequency bandwidth and/or range resulting in ACP that may be in excess of standards typically associated with one of these known modulation formats. Those skilled in the art will appreciate that the type of RF amplifier does not limit the present invention, nor does the modulation scheme used. Rather, the present invention applies equally well to all types of RF amplifiers and modulation schemes and standards, both presently known and yet unknown.

Predistorter 14 comprises a data structure 16 and a vector modulator 22 for predistorting or applying correction factors to the RF input signal (RF INPUT) to thereby compensate or correct for non-linearities in the response of RF power amplifier 12. Such predistortion reduces ACP, as may be measured at RF OUTPUT by those of skill in the art, while reducing the potential for adjacent channel interference.

In the present embodiment 10, data structure 16 may be realized in a Field-Programmable Gate Array (FPGA), as will be appreciated by those of skill in the art having the benefit of the instant disclosure. Alternatively, an application-specific integrated circuit (ASIC) may be used. Data structure 16 may also be one or more memory chips, e.g., FPGAs or any other storage device, and may be embedded on logic chips. Thus, those skilled in the art will also appreciate that practically any form or type of memory may be used as desired for data structure 16 without departing from the spirit of the present invention.

More specifically, vector modulator 22 applies I and Q correction factors from LUTs 18a, 18b to the RF input signal (RF INPUT). As a practical matter, and like amplifier 12, vector modulator 22 also has a non-linear response with respect to both amplitude and phase. Generally, non-linearities exhibited by a vector modulator will be considerably less than those exhibited by an RF power amplifier. However, despite being considerably less, non-linearities of a vector modulator may also result in an increase in ACP and the potential for adjacent channel interference.

To this end, predistorters may include additional LUTs having correction factors specific to correction for amplitude and phase non-linearities in a vector modulator. The inclusion of these additional LUTs increases the memory requirements for a predistorter, thereby increasing the cost. The inclusion of additional LUTs also increases time necessary to load correction factors into the predistorter, thereby increasing the settling time as will be described in more detail hereinafter. As will be appreciated by those of skill in the art, other problems and/or limitations may also be introduced by the inclusion of additional LUTs dedicated to correction for non-linearities in a vector modulator.

In contrast, and in accordance with one aspect, the present invention recognizes the relative difference in magnitude of the non-linearities associated with an RF power amplifier and a vector modulator and combines in a data structure corrections for amplitude and phase errors in an RF power amplifier with corrections for non-linearities associated with a modulator used therein. Such a combining of corrections in single correction factors eliminates the need for a pair of LUTs dedicated to correction for non-linearities in a vector modulator. Moreover, by combining corrections memory requirements for a predistorter are reduced, along with the associated costs therefore. The time required to load correction factors into memory is likewise reduced, thereby reducing the settling time.

For example, and as illustrated in embodiment 10 of FIG. 1, data structure 16 comprises a first pair of LUTs 18a, 18b containing correction factors for amplitude and phase corrections, e.g., one for in-phase (I) 18a and one for quadrature-phase (Q) 18b signal components, in the response of RF power amplifier 12. Further, the correction factors in LUTs 18a, 18b also include magnitude and phase correction for vector modulator 22 used therewith. By combining the amplitude and phase corrections for RF power amplifier 12 with the amplitude and phase corrections for vector modulator 22, the present invention reduces the number of LUTs often found in many predistorters, and thereby reduces memory requirements. Such a reduction in memory requirements may result in a cost savings, while improving the response time of amplifier system 10, as will be discussed hereinafter.

Data structure 16 further comprises a second pair of LUTs 20a, 20b, again, one for I and one for Q, respectively, to compensate for memory effects in the response of RF power amplifier 12. Memory effects in RF power amplifiers are well known to those of skill in the art. Generally, memory effects cause additional odd order, e.g., $3^{rd}$, $5^{th}$, $7^{th}$, etc., distortion, such distortion also being termed IMD products, and resulting in ACP and the potential for adjacent channel interference. For example, memory effects may include, but are not limited to, self-heating of the RF power amplifier and decoupling of the RF power amplifier from a power supply. In self-heating, as the RF power amplifier power level increases, heat is built up in the devices used in the RF power amplifier. Conversely, a decrease in the power level causes cooling of the devices. Such heating and cooling of the devices generally results in odd order distortion. Similarly, during rapid changes in response to an input signal, the drain of a semiconductor device used in the RF power amplifier may be tightly coupled to loading variations exhibited by the power supply used for the amplifier, giving rise to odd order distortion. Those skilled in the art will be aware of other potential memory effects and the benefits of compensating as desired therefore.

Generally, corrections are desired for both amplitude and phase non-linearities and memory effects in an RF power amplifier to achieve the greatest reduction in ACP. Corrections are also desired for amplitude and phase non-linearities in a modulator used to apply the corrections. Typically, modulators do not suffer from memory effects, as they are generally passive devices. In recognition of modulators not suffering from memory effects and in accordance with another aspect, the present invention omits corrections for memory effects in a modulator.

Returning to corrections for amplitude and phase non-linearities and memory effects in an RF power amplifier and amplitude and phase non-linearities in a modulator, one approach is to ignore the memory effects in the RF power amplifier and compensate just for amplitude and phase non-linearities in the RF power amplifier and the modulator, accepting an increase in ACP due to memory effects. In this approach, a single pair of LUTs may be used (such as LUTs 18a, 18b shown in FIG. 1), combining the corrections for amplitude and phase non-linearities in the RF power and the modulator. Unfortunately, such an approach may not realize the greatest reduction in ACP and may not adequately reduce ACP to meet standards prescribed by a particular modulation scheme. However, such an approach may meet standards associated with some modulation schemes and this may be accomplished in accordance with the present invention.

Another approach is to use three pairs of LUTs, each pair dedicated to correcting for I/Q amplitude and phase non-linearities in an RF power amplifier, memory effects in an RF power amplifier, and amplitude and phase non-linearities in a modulator, respectively. This approach assumes that separate LUTs are required since differences may not be predicted based on a specific signal. As such, FIGS. 1 and 2 would each have and additional pair of LUTs in accordance with such an embodiment of the invention.

However, it has been found that the spread or range of correction values in the LUTs associated with correction for memory effects in an RF power amplifier is rather small. In addition, the correction factors associated with corrections for memory effects in an RF power amplifier are also rather small in magnitude in comparison to correction factors associated with amplitude and phase non-linearities in an RF power amplifier and a modulator. Thus, one embodiment of the invention combines the amplitude and phase correction for an RF power amplifier with the amplitude and phase correction for a modulator in a first pair of LUTs, e.g., 18a, 18*b*, while using a second pair of LUTs, e.g., 20*a*, 20*b*, to compensate for memory effects in an RF power amplifier.

Turning to how correction factors are selected, amplifier system 10 further comprises coupler 24. Coupler 24 is coupled to predistorter 14 and receives RF input signal (RF INPUT). Coupler 24 is configured to sample a portion of the RF input signal (RF INPUT) power so that predistorter 14 may modify the RF input signal (RF INPUT) as a function of both the instantaneous input signal power and the rate of change in the input signal power, as will be described hereinafter. Those skilled in the art will appreciate that predistorter 14 may, in other embodiments, alternatively comprise coupler 24 without departing from the spirit of the present invention.

Figure 2:
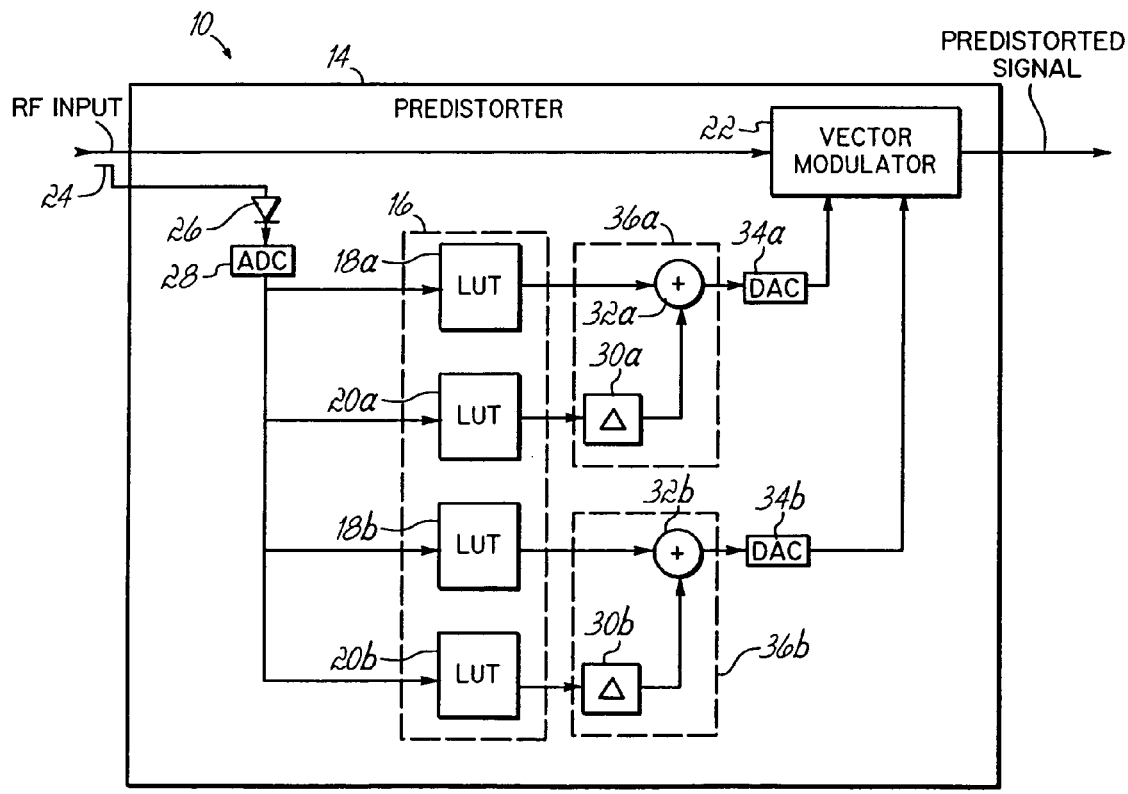
FIG. 2 is a more detailed schematic diagram of the predistorter shown in FIG. 1.

Referring now to FIG. 2, a more detailed schematic of predistorter 14, shown in FIG. 1, is provided. It will be noted that coupler 24 has been included for ease of explanation. As illustrated in FIG. 2, predistorter 14 comprises data structure 16, envelope detector 26, analog-to-digital converter (ADC) 28, differentiator circuits 30*a*, 30*b*, summers 32*a*, 32*b*, digital-to-analog converters (DACs) 34*a*, 34*b*, and vector modulator 22. Data structure 16 comprises a first pair of LUTs 18*a*, 18*b* and a second pair of LUTs 20*a*, 20*b*, as previously described in conjunction with FIG. 1. Differentiator circuits 30*a*, 30*b* and summers 32*a*, 32*b* are part of circuits 36*a*, 36*b*, respectively.

In operation, coupler 24 couples a sampled portion of the RF input signal (RF INPUT) to envelope detector 26. Envelope detector 26 generates an analog signal that is representative of the instantaneous input signal envelope from the sampled portion of the RF input signal (RF INPUT), coupling the analog signal to ADC 28. ADC 28 converts the analog signal to a digital signal. ADC 28 couples the digital signal representative of the instantaneous input signal envelope to data structure 16, wherein the signal is coupled to LUTs 18*a*, 20*a*, 18*b*, 20*b* and used to select appropriate correction factors. Based on the signal representing the RF input, the tables are accessed to obtain the desired correction factors according to look-up table principles.

LUTs 18*a*, 20*a*, 18*b*, 20*b* provide selected correction factors to summer 32*a*, differentiator circuit 30*a*, summer 32*b* and differentiator circuit 30*b* within circuits 36*a*, 36*b*, respectively. Differentiator circuits 30*a*, 30*b* are configured to apply a difference equation to successive corrections factors to thereby predistort the RF input signal (RF INPUT) based the on the rate of change of the input signal power. That is, differentiator circuits 30*a*, 30*b* provide correction factors that account for the inability of the amplifier to rapidly change output power level. The causes for amplifier inability to rapidly change output levels may be due to, for example, self heating of active devices in the amplifier, decoupling of active devices in the amplifier from a power supply, etc. Such causes are generally referred to as memory effects. Thus, such an application of a difference equation allows correction for memory effects exhibited by an amplifier.

Summers 32*a*, 32*b* are configured to combine the correction factors from LUTs 18*a*, 18*b* for amplitude and phase correction associated with the instantaneous input signal power and correction factors from LUTs 20*a*, 20*b* for correction derived from the application of a difference equation, and associated with the rate of change of the input signal envelope. Summers 32*a*, 32*b* therefore output digital signals that compensate based on both the instantaneous input signal envelope and the rate of change in the input signal power, coupling the signals to DACs 34*a*, 34*b*, respectively.

DACs 34*a*, 34*b* convert the digital signals to analog signals, coupling the analog signals to vector modulator 22. Vector modulator 22 is configured to combine the analog signals with the RF input signal (RF INPUT), also coupled thereto, to provide a predistorted signal (PREDISTORTED SIGNAL) for use in compensating for non-linearities in an RF power amplifier, such as RF amplifier 12, shown in FIG. 1, to thereby reduce ACP and the potential for adjacent channel interference.

Figure 3:
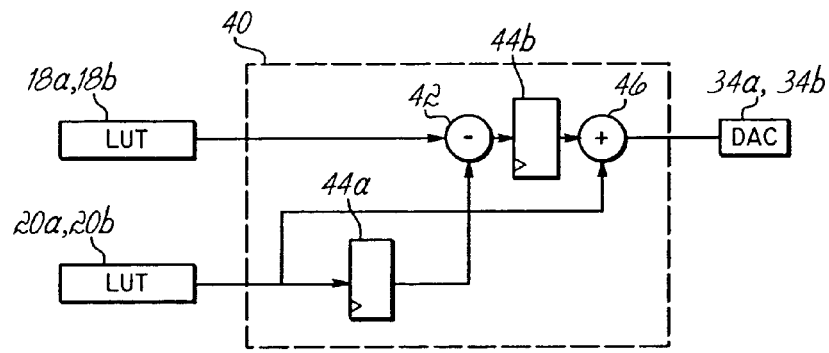
FIG. 3 is a schematic diagram of a circuit for applying the difference equation in the predistorter of FIGS. 1 and 2.

Referring now to FIG. 3, and in accordance with a second aspect of the present invention, circuit 40 is provided for applying a difference equation in compensating for memory effects in an RF power amplifier.

The straightforward interpretation of a difference equation is to add to the current sample (e.g., sample 2), or correction factor, the difference between the subsequent sample (e.g., sample 3), or correction factor, and the previous sample (e.g., sample 1), or correction factor, to arrive at a new sample or correction factor (e.g., sample 4, where samples (3−1)+2=4). Delay circuitry, or clocking, is typically used to apply the desired sequencing to the samples.

A practical problem exists in the prior art in that it is difficult with current delay circuitry to execute a fast three-operand function to meet requirements, e.g., settling time or the time required to bring the RF power amplifier into specification, imposed by industry on many predistorters. The use of delay circuits also increases the cost of a predistorter.

Circuit 40 addresses problems in the prior art and provides a unique and straightforward application of a difference equation to reduce delay and also to reduce the associated costs. Circuit 40, as illustrated in FIG. 3, may also serve as an alternative to circuits 36*a*, 36*b*, shown in FIG. 2. To more clearly show connectivity to circuit 40, LUTs 18*a*, 18*b*, 20*a*, 20*b* and DACs 34*a*, 34*b* shown in FIG. 2, have also been included in FIG. 3.

As illustrated, circuit 40 comprises subtracter 42, delay circuits 44*a*, 44*b*, and summer 46. One example of a delay circuit is a flip-flop. Other types of delay circuits will be readily apparent to those of skill in the art.

As will be appreciated by those of skill in the art, a clock (not shown) is coupled to delay circuits 44*a*, 44*b* for purposes of providing timing and/or delaying correction factors or samples from LUTs 18*a*, 18*b*, 20*a*, 20*b*.

It will also be appreciated that in a digital predistorter, such as predistorter 14 shown in FIGS. 1 and 2, samples of the RF input signal (RF INPUT) will be taken and correction factors selected based thereon. Thus, at any given point in time, there will be a sample of the input signal (RF INPUT) and corresponding correction factors for that sample. Therefore, in the following discussion, the terms correction factors and samples may be used interchangeably with regard to LUTs, but it will be understood that correction factors or samples from the LUTs are based on corresponding samples of the RF input signal.

In operation, samples from LUTs 18*a*, 18*b* are coupled to subtracter 42. Similarly, samples from LUTs 20*a*, 20*b* are coupled to delay circuit 44*a* and summer 46. Delay circuit 44*a* delays the application of samples from LUTs 20*a*, 20*b*, coupling the samples to subtracter 42. Subtracter 42 subtracts from the subsequent samples (e.g., sample 3) from LUTs 18*a*, 18*b* the current sample (e.g., sample 2) from LUTs 20*a*, 20*b*. This mathematically creates 3−2 in sample chronology. The difference result is coupled to delay circuit 44*b*. Delay circuit 44*b* delays the result of the subtraction one sample. The subsequent sample minus the current sample (or e.g., 3−2) then becomes the current sample minus the previous sample (or e.g., 2−1). The delayed result is then coupled to summer 46. It will be noted that the subsequent sample, e.g., sample 3, is now coupled from LUTs 20*a*, 20*b* to summer 46. Summer 46 adds the current sample minus the previous sample (e.g., 2−1) to the subsequent sample (e.g., sample 3) to arrive at a new sample or correction factor (e.g., sample 4). Specifically, samples 2−1+3=4, and the result is coupled to DACs 34*a*, 34*b*. Thus, circuit 40 achieves the application of a difference equation but does so in a way that addresses problems in the prior art. For example, the invention reduces delay and the associated costs, requiring fewer delay circuits or, for example, flip-flops.

Figure 4:
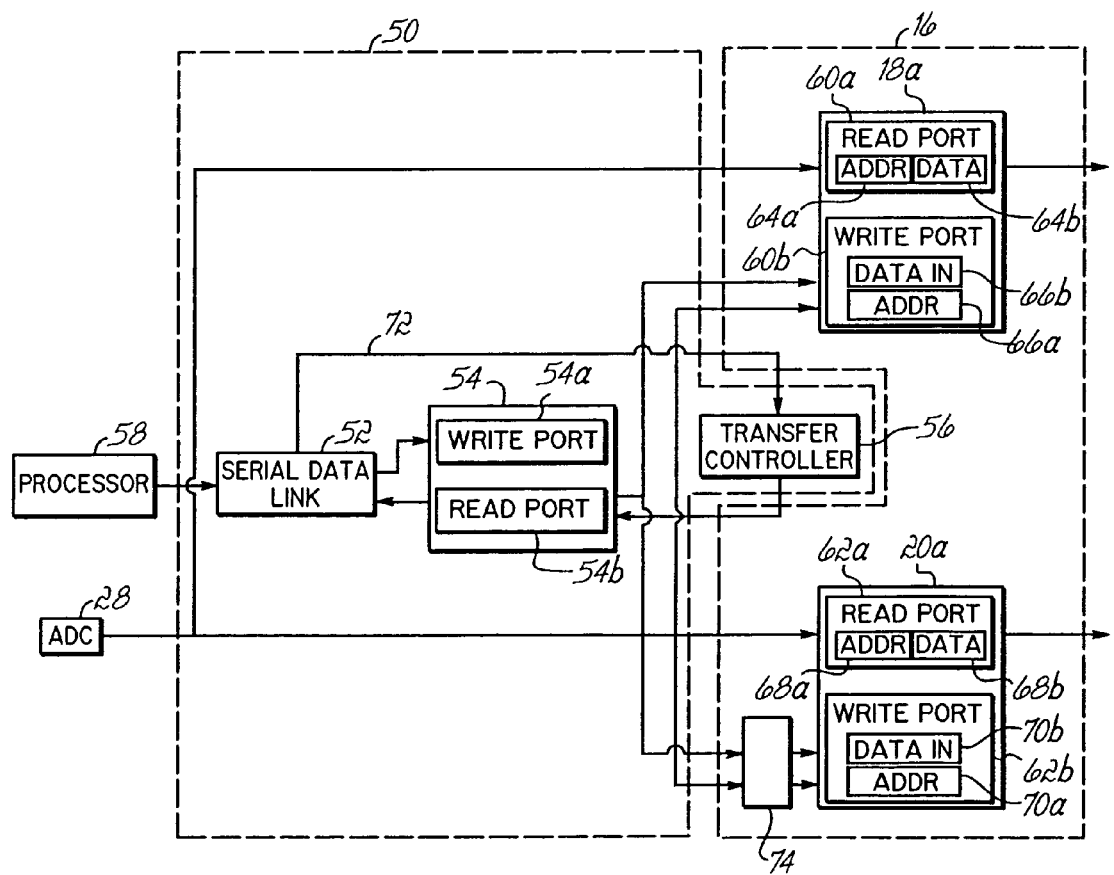
FIG. 4 is a schematic diagram of a circuit for transferring correction and/or scaling factors into the data structure shown in FIGS. 1 and 2.

Turning now to FIG. 4, an additional aspect of the present invention deals with storing correction factors in LUTs in a data structure. Storing correction factors in LUTs in a data structure may also be referred to as calibrating the LUTs and/or the amplifier system that uses a data structure containing LUTs. For example, and referring once again to FIG. 1, correction factors stored in LUTs 18*a*, 18*b*, 20*a*, 20*b* may be selected to minimize or reduce ACP, as measured at the output of RF power amplifier 12 (RF OUTPUT). The correction factors in LUTs 18*a*, 18*b*, 20*a*, 20*b* are particular or specific to RF power amplifier 12, as gain and phase response characteristics typically vary from one RF power amplifier to the next. Such correction factors that are set up to be specific to RF power amplifier 12, and to minimize or reduce ACP, are thus said to calibrate the amplifier or amplifier system 10.

One prior art approach to storing correction factors in LUTs is to serially transfer, each individual correction factor one at a time, into memory. Unfortunately, such an approach has various shortcomings. For instance, individually transferring each correction factor into memory one at a time takes a considerable amount of time. If the RF amplifier is in operation during the transfers, distortion may occur at the output of the RF amplifier for the duration of the transfers. Such distortion may be, and is often, referred to as a "glitch". Therefore, the transfer time affects the duration of such "glitches". Transfer time also dictates the amount of time necessary to bring an RF power amplifier into specification, e.g., settling time. Thus, it is desirable to minimize the time necessary to transfer correction factors into the LUTs, thereby minimizing glitches and reducing settling time.

In contrast, and rather than serially transferring each individual correction factor used to compensate for memory effects in an amplifier, the present invention transfers scaling factors associated with coefficients of a polynomial into memory. This polynomial describes the correction factors normally found in the LUTs that correct for memory effects in an RF power amplifier. The present invention then uses the scaling factors with the polynomial to calculate the correction factors for memory effects in memory. Once the correction factors are calculated, they are used to populate the LUTs (such as LUTs 20*a*, 20*b* shown in FIGS. 1 and 2), and are thus stored in memory. This aspect of the present invention minimizes the time necessary to transfer correction factors for memory effects since in fact, only scaling factors are transferred. This aspect of the present invention thereby minimizes glitches and reduces settling time.

For example, a polynomial describing the correction factors normally found in the LUTs that correct for memory effects in an RF power amplifier may be of the form $Wx^2+Yx^4+(Offset)$. Further, and still in accordance with that aspect of the present invention that deals with storing correction factors in LUTs, such a polynomial may be scaled or offset. When such a polynomial is scaled or offset, as indicated, the minimum value of the polynomial is set equal to zero. Such scaling or offset is possible because corrections for memory effects depend on the difference in the correction factors, hence the use of the difference equation described above, and not the actual values of the correction factors. Further, since it generally requires less memory to store smaller values, the present invention reduces memory requirements necessary to store correction factors that correct for memory effects in an amplifier.

Still referring to FIG. 4, a schematic diagram of a circuit 50 for transferring correction and/or scaling factors into data structure 16 is illustrated. Again, data structure 16 comprises LUTs 18*a*, 18*b*, 20*a*, 20*b* that contain correction factors that correct for instantaneous amplitude and phase in an RF power amplifier and a modulator used therein and memory effects in an RF power amplifier, such as RF power amplifier 12 and modulator 22, shown in FIG. 1. Such correction factors for memory effects are calculated from scaling factors and based upon a polynomial describing the correction factors to be stored in LUTs 20*a*, 20*b*. Moreover, such a polynomial is scaled or offset as noted above. Data structure 16 further comprises at least one circuit 74 configured to calculate and scale or offset correction factors for memory effects. An example of such a circuit 74 will be provided and described in conjunction with FIG. 5. A processor 58, coupled to circuit 50, may be used to provide the correction and scaling factors.

Circuit 50 comprises serial data link 52, dual-port buffer 54, and transfer controller 56, individual examples for all of which are known in the art. Generally, circuit 50 is coupled to a processor and a data structure, such as processor 58 and data structure 16. More specifically, and as further illustrated in FIG. 4, circuit 50 is coupled to LUTs 18*a*, 20*a*, also shown in FIGS. 1 and 2. Those skilled in the art will appreciate that LUTs 18*b*, 20*b* may also be coupled to circuit 50; however, LUTs 18*b*, 20*b* are not included for ease of explanation, and because such explanation of LUTs 18*b*, 20*b* would be duplicative in nature to that of LUTs 18*a*, 20*a*. ADC 28 is, however, included.

Serial data link 52 is coupled to processor 58, and is configured to receive and transmit correction and/or scaling factors, as will be described hereinafter. Processor 58 may be external to data structure 16, as illustrated in FIG. 4, yet may alternatively comprise predistorter 14, shown in FIGS. 1 and 2.

Processor 58 may be generally configured to load in and read-back correction and/or scaling factors from LUTs 18*a*, 18*b*, 20*a*, 20*b* in data structure 16. Loading correction and/or scaling factors in LUTs allow calibration of the LUTs, as previously described and as will be further described, whereas reading-back correction factors allows assurance that the correction factors were loaded or stored properly in memory.

For example, LUTs 18*a*, 20*a* comprise read and write ports 60*a*, 60*b* and 62*a*, 62*b*, respectively. Each port 60*a*, 60*b*, 62*a*, 62*b* comprises address and data portions 64*a*, 64*b*, 66*a*, 66*b*, 68*a*, 68*b*, 70*a*, 70*b*, respectively.

Serial data link 52 is also coupled to dual-port buffer 54, transfer controller 56, and LUTs 18*a*, 20*a*. Dual-port buffer 54 comprises a write port 54*a* and a read port 54*b*. More specifically, serial data link 52 transfers correction and/or scaling factors from processor 58 to write port 54*a* and reads-back correction factors from read port 54*b*. Read port 54*b* is coupled to data input DATA 66*b* of write port 60*b* of LUT 18a and circuit 74. Circuit 74 is coupled to data input DATA 70b of write port 62b of LUT 20a, and is configured to calculate correction factors for memory effects, as will be described in conjunction with FIG. 5. The calculated correction factors are then used to populate LUTs 20a, 20b.

Transfer controller 56 is also coupled to read port 54b of dual-port buffer 54 and addresses ADDR 66a, 70a of write ports 60b, 62b of LUTs 18a, 20a, respectively, and is configured to address the ports and control the transfer of correction and/or scaling factors. The transfer of correction and/or scaling factors is initiated via a control line 72 coupling serial data link 52 and transfer controller 56.

Once correction factors are stored in data structure 16, ADC 28 is coupled to addresses ADDR 64a, 68a of read ports 60a, 62a of LUTs 18a, 20a, respectively, and, in turn, couples the correction factors stored in data structure 16 from data outputs DATA 64b, 68b for use in providing a predistorted signal, such as to vector modulator 22 shown in FIGS. 1 and 2. It will be appreciated that the loading of correction and/or scaling factors may coincide with the operation of an RF power amplifier, such as RF power amplifier 12, shown in FIGS. 1 and 2.

Figure 5:
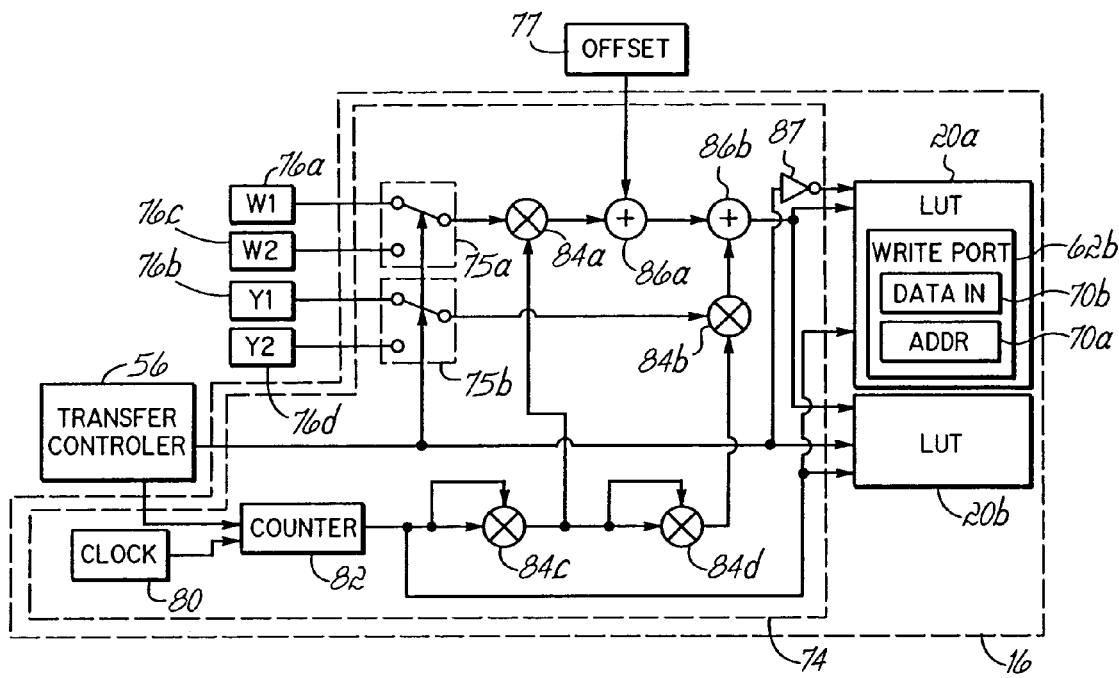
FIG. 5 is a schematic diagram of a circuit for calculating correction factors that may be used in compensating for memory effects in the RF power amplifier shown in FIG. 1 from scaling factors transferred by the circuit shown in FIG. 4, and within a data structure; and, FIG. 6 illustrates a message containing scale factors used in calculating the correction factors in the circuit of FIG. 5.
Figure 6:
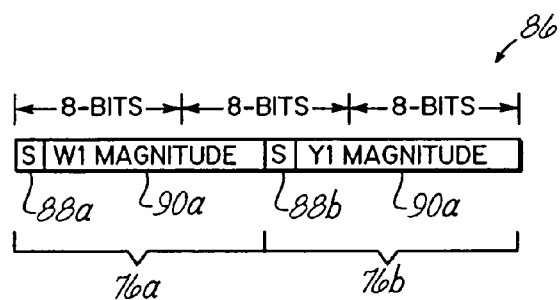

Referring now to FIGS. 5 and 6, FIG. 5 illustrates a circuit 74 for calculating correction factors using a polynomial within memory, such as data structure 16, also shown in FIGS. 1–4, for use in compensating for memory effects in an RF power amplifier. That is, the outputs from circuit 74 are used to populate LUTs 20a, 20b or any other LUTs which provide correction factors that compensate for memory effects exhibited by the RF power amplifier. Circuit 74 also scales or offsets the polynomial as will be described herein. FIG. 6 illustrates a message containing scale factors used in calculating the correction factors.

Referring first to FIG. 6, message 86 comprises two 12-bit words or signed-scale factors (W1, Y1) 76a, 76b, as indicated by sign bits 88a, 88b, respectively. In addition to sign bits 88a, 88b, each word (W1, Y1) 76a, 76b also includes magnitude portions 90a, 90b. For example, each word (W1, Y1) 76a, 76b may be transferred in three 8-bit segments, as shown, when used in an 8-bit system, such as system 10 shown in FIG. 1. Also, words (W1, Y1) 76a, 76b may be associated with in-phase (I) corrections, while additional signed-scale factors, e.g., (W2, Y2) 76c, 76d, shown in FIG. 5, may be associated with quadrature-phase (Q) corrections and transferred in like manner.

Those skilled in the art will appreciate that words of other lengths, either signed or unsigned may be used for scaling factors without departing from the spirit of the present invention. Moreover, such words may be transferred in segments having other than 8-bits, as may be desired by those of skill in the art.

Words (W1, Y1 and W2, Y2) 76a–d correspond to LUTs 20a, 20b, respectively, in data structure 16, and may be used to calculate the correction factors to be stored in LUTs 20a, 20b in data structure 16. Such calculations may be based on a polynomial describing the relationship between the correction factors used to correct for memory effects in an RF power amplifier as noted above. The words are coefficients or scaling factors for the polynomial that is used to provide the correction factors for memory effects. For example, words (W1, Y1, W2, Y2) 74a–d may be received by processor 58 and coupled to circuit 74, through circuit 50, as shown in FIG. 4 and previously described.

Turning now to FIG. 5, a schematic diagram for circuit 74 that is used to calculate correction factors within data structure 16 is illustrated. Also included in FIG. 5 for purposes of further illustration are LUTs 20a, 20b within data structure 16 and transfer controller 56.

Circuit 74 comprises clock 80, counter 82, multipliers 84a–d, summers 86a, 86b, and inverter 87, examples for all of which are well known to those of skill in the art. Clock 80 is coupled to counter 82 and is configured to cause counter 82 to count. Counter 82 begins counting based on an input from transfer controller 56, also shown in FIG. 4. For example, when used in an 8-bit system, counter 82 may be configured to count from 0 to 255, e.g., 0, 1, 2, . . . 255, after which counter 82 stops.

Counter 82 generally couples the count to multiplier 84c and LUTs 20a, 20b. More specifically, and for example, counter 82 couples the count to the address (ADDR) 70a of write port 62b of LUT 20a, and uses the count to address the write port in writing correction factors to LUT 20a. Inverter 87 coupled intermediate counter 82 and address (ADDR) 70a of write port 62b of LUT 20a allows alternate enabling of addressing LUTs 20a, 20b. Those skilled in the art will appreciate that LUT 20b may also comprise a write port having addresses that correction factors may be written to; however, such a write port is not included for ease of explanation, and because such explanation would be duplicative in nature to that of LUT 20a.

Multiplier 84c is configured to square the count. Thus, in keeping with the example, if the count is from 0 to 255, e.g., 0, 1, 2, 3, . . . 255, then the squared count is 0, 1, 4, 9, . . . 65,025. Multiplier 84c couples the squared count to multipliers 84a, 84d. Multiplier 84d is configured to square the squared count or raise the count to the fourth power. Thus, continuing with the example, the count to the fourth power, is 0, 1, 16, 81, . . . 4,228,250,625.

Words containing scale factors are also coupled to multipliers 84a, 84b. For example, and as illustrated and described in conjunction with FIG. 6, words (W1, Y1) 76a, 76b and (W2, Y2) 76c, 76d may be alternately coupled to multipliers 84a, 84b. Such alternate coupling may be accomplished through the use of switches 75a, 75b coupled intermediate words (W1, W2) 76a, 76c and (Y1, Y2) 76b, 76d and multipliers 84a, 84b, respectively, switches 75a, 75b also being couple to and controlled by transfer controller 56. Words (W1, Y1, W2, Y2) 76a–d may be coupled from processor 58 and circuit 50 as shown and described in conjunction with FIG. 4.

Multipliers 84a, 84b are configured to multiply signed-scale factors within words (W1, Y1, W2, Y2) 76a–d by the squared count and the count to the fourth power, respectively. Thus, if the signed-scale factors are 12-bits, e.g., 11-bit plus a sign bit, the squared count is 0, 1, 4, 9, . . . 65,025, or 16 bits, and the count to the fourth power, is 0, 1, 16, 81, . . . 4,228,250,625, the products of these multiplications are 48-bits or more. Multipliers 84a, 84b truncate these products to 12-bits, using only the twelve most significant bits, as is common practice in digital systems that represent physical quantities. Multipliers 84a, 84b couple the 12-bit products, e.g., $Wx^2$, $Yx^4$, where x is the count, to summers 86a, 86b, respectively.

Also coupled to summer 86a is an offset 77. As will be appreciated by those of skill in the art, offset 77 may, like words (W1, Y1, W2, Y2), be transferred into data structure 16 from a processor 58 through a circuit 50, both of which are shown in FIG. 4. Again, the use of an offset allows the minimum value of the polynomial to be set equal to zero, thereby reducing the required memory size for LUTs 20a, 20b. Summer 86a adds the offset 77 to the 12-bit product, e.g., $Wx^2$, from multiplier 84a, coupling the resulting expression, e.g., $Wx^2+(Offset)$, to summer 86b.

Summer 86b adds the 12-bit product, e.g., $Yx^4$, from multiplier 84b to the expression from summer 86a, e.g., $Wx^2+$(Offset), the resulting expression being $Wx^2+Yx^4+$(Offset), in keeping with the example. Summer 86b couples the resulting expression, e.g., $Wx^2+Yx^4+$(Offset), as correction factors to LUTs 20a, 20b where they are stored based on corresponding addressing by counter 82 and alternate enablement by transfer controller 56. LUTs 20a, 20b now each contain 256 12-bit correction factors. Thus, circuit 74 allows the calculation of correction factors that may be used to correct for memory effects in an RF power amplifier within a data structure.

Thus, as described hereinabove, the present invention provides a predistorter for use with a RF power amplifier. Such a predistorter reduces non-linearities in the response of the RF power amplifier, thereby reducing ACP and the potential for adjacent channel interference. More specifically, the present invention combines in a data structure corrections for amplitude and phase errors in the RF power amplifier with corrections for non-linearities associated with a modulator used therein. The present invention also omits corrections for memory effects in such a modulator. The present invention also provides a novel circuit for applying a difference equation in compensating for memory effects in the RF power amplifier. The present invention also transfers scaling factors into a data structure, calculates correction factors using a polynomial within the data structure, and populates look-up tables with correction factors within the data structure that are then used to compensate for memory effects in an RF power amplifier. The present invention also scales the correction factors that compensate for memory effects to reduce memory size. Thus, the present invention addresses those shortcomings identified in the prior art, as well others, not identified. In doing so, the present invention provides a predistorter with reduced memory requirements and settling time, while reducing the cost of the predistorter.

Various additional modifications may be made to the illustrated embodiments without departing from the spirit and scope of the invention. Therefore, the invention lies in the claims hereinafter appended.

What is claimed is:

1. A predistorter configured for use with an RF power amplifier, the predistorter comprising:
   a vector modulator configured to receive an RF input signal and apply a correction thereto using correction factors;
   a data structure coupled to the vector modulator and storing the correction factors;
   the data structure including a first pair of look-un tables configured for storing amplitude and phase correction factors, the correction factors of the first pair of look-up tables compensating for amplitude and phase non-linearities in the responses of both the RF power amplifier and the vector modulator;
   the data structure further including a second pair of look-up tables configured for storing correction factors to compensate for memory effects in the response of the RF power amplifier.

2. The predistorter of claim 1, wherein the first pair of look-up tables includes one for in-phase (I) and one for quadrature-phase (Q) signal components.

3. The predistorter of claim 2, wherein the second pair of look-up tables includes one for in-phase (I) and one for quadrature-phase (Q) signal components.

4. The predistorter of claim 1, further comprising a differentiator circuit coupled to at least one of each of the first and second pairs of look-up tables and configured to apply a difference equation to the correction factors in compensating for memory effects in the RF power amplifier.

5. The predistorter of claim 4, the differentiator circuit comprising:
   a subtracter coupled to the first pair and second pairs of look-up tables and configured to subtract a previous correction factor from the second pair of look-up tables from a current correction factor from the first pair of look-up tables;
   a first delay circuit coupled intermediate the second pair of look-up tables and the subtracter and configured to delay correction factors from the second pair of look-up tables;
   a second delay circuit coupled to the subtracter and configured to delay the difference between the current and the previous correction factors; and
   a summer coupled to the second delay circuit and the second pair of look-up tables and configured to add the difference between the current and previous correction factors to a subsequent correction factor to arrive at a correction factor that is used to compensate for memory effects in an RF power amplifier.

6. The predistorter of claim 1, further comprising a coupler coupled to the vector modulator and the look-up tables and configured to receive the RF input signal and sample a portion of the RF input signal and select correction factors from the look-up tables based on the sampled portion of the RF input signal;
   wherein the predistorter modifies the RF input signal as a function of both instantaneous input signal envelope and the rate of change in the input signal envelope.

7. The predistorter of claim 6, further comprising an envelope detector disposed intermediate the coupler and the look-up tables and configured to generate an analog signal that is representative of the instantaneous input signal envelope from the sampled portion of the RF input signal.

8. The predistorter of claim 7, further comprising an analog-to-digital converter disposed intermediate the envelope detector and the look-up tables and configured to convert the analog signal to a digital signal.

9. The predistorter of claim 1, further comprising a circuit configured to transfer correction factors into the data structure.

10. A predistorter configured for use with an RF power amplifier, the predistorter comprising:
    a vector modulator configured to receive an RF input signal and apply a correction thereto using correction factors;
    a data structure coupled to the vector modulator and including a first pair of look-up tables configured for storing amplitude and phase correction factors to compensate for amplitude and phase non-linearities in the responses of both the RF power amplifier and the vector modulator and a second pair of look-up tables configured for storing correction factors to compensate for memory effects in the response of the RF power amplifier;
    a circuit configured to transfer scaling factors into the data structure, the data structure configured to calculate correction factors for storage in the second pair of look-up tables from the scaling factors based on a polynomial.

11. The predistorter of claim 10, wherein the polynomial is of the form $Wx^2+Yx^4$, and W and Y are scaling factors.

12. The predistorter of claim 10, wherein the data structure is further configured to scale the calculated correction factors.

13. The predistorter of claim 10, the circuit comprising:
a serial data link configured to receive and transmit at least one of correction and scaling factors;
a dual-port buffer coupled to the serial data link and the data structure; and,
a transfer controller coupled to the serial data link, the dual-port buffer, and the data structure and configured to control the transfer of at least one of correction and scaling factors.

14. The predistorter of claim 10, including a second circuit to calculate correction factors comprising:
a first multiplier configured to receive a first scale factor associated with the second pair of look-up tables;
a second multiplier configured to receive a second scale factor associated with the second pair of look-up tables;
a counter coupled to the data structure and configured to provide a count and address the second set of look-up tables comprising the data structure based on the count;
a third multiplier coupled to the counter and the first multiplier and configured to square the count;
a fourth multiplier coupled to the second and third multipliers and configured to square the squared count, raising the count to the fourth power;
wherein the squared count and the count to the fourth power are combined with first and second multipliers to calculate corrections factors.

15. An amplifier system, the system comprising:
an RF power amplifier; and
a predistorter coupled to the RF power amplifier, the predistorter comprising:
a vector modulator configured to receive an RF input signal and apply a correction thereto using correction factors;
a data structure coupled to the vector modulator and storing the correction factors;
the data structure including a first pair of look-up tables configured for storing amplitude and phase correction factors, the correction factors of the first pair of look-up tables compensating for amplitude and phase non-linearities in the response of both the RF power amplifier and the modulator;
the data structure further including a second pair of look-up tables configured for storing correction factors to compensate for memory effects in the response of the RF power amplifier.

16. The amplifier system of claim 15, wherein the first pair of look-up tables includes one for in-phase (I) and one for quadrature-phase (Q) signal components.

17. The amplifier system of claim 16, wherein the second pair of look-up tables includes one for in-phase (I) and one for quadrature-phase (Q) signal components.

18. The amplifier system of claim 15, the predistorter further comprising a differentiator circuit coupled to at least one of each of the first and second pairs of look-up tables and configured to apply a difference equation to the correction factors in compensating for memory effects in the RF power amplifier.

19. The amplifier system of claim 18, the differentiator circuit comprising:
a subtracter coupled to the first pair and second pairs of look-up tables and configured to subtract a previous correction factor from the second pair of look-up tables from a current correction factor from the first pair of look-up tables;
a first delay circuit coupled intermediate the second pair of look-up tables and the subtracter and configured to delay correction factors from the second pair of look-up tables;
a second delay circuit coupled to the subtracter and configured to delay the difference between the current and the previous correction factors; and
a summer coupled to the second delay circuit and the second pair of look-up tables and configured to add the difference between the current and the previous correction factors to a subsequent correction factor to arrive at a correction factor that is used to compensate for memory effects in the RF power amplifier.

20. The amplifier system of claim 15, the predistorter further comprising a coupler coupled to the vector modulator and the look-up tables and configured to receive the RF input signal and sample a portion of the RF input signal and select correction factors from the look-up tables based on the sampled portion of the RF input signal;
wherein the predistorter modifies the RF input signal as a function of both instantaneous input signal envelope and the rate of change in the input signal envelope.

21. The amplifier system of claim 20, the predistorter further comprising an envelope detector disposed intermediate the coupler and the look-up tables and configured to generate an analog signal that is representative of the instantaneous input signal envelope from the sampled portion of the RF input signal.

22. The amplifier system of claim 21, the predistorter further comprising an analog-to-digital converter disposed intermediate the envelope detector and the look-up tables and configured to convert the analog signal to a digital signal.

23. The amplifier system of claim 15, the predistorter further comprising a circuit configured to transfer correction factors into the data structure.

24. An amplifier system, the system comprising:
an RF power amplifier; and
a predistorter coupled to the RF power amplifier, the predistorter comprising:
a vector modulator configured to receive an RF input signal and apply a correction thereto using correction factors;
a data structure coupled to the vector modulator and including a first pair of look-up tables configured for storing amplitude and phase correction factors to compensate for amplitude and chase non-linearities in the responses of both the RF power amplifier and the vector modulator and a second pair of look-up tables configured for storing correction factors to compensate for memory effects in the response of the RF power amplifier;
a circuit further configured to transfer scaling factors into the data structure, the data structure configured to calculate correction factors for storage in the second pair of look-up tables from the scaling factors based on a polynomial.

25. The amplifier system of claim 24, wherein the polynomial is of the form $Wx^2+Yx^4$, and W and Y are scaling factors.

26. The amplifier system of claim 24, wherein the data structure is further configured to scale the calculated correction factors.

27. The amplifier system of claim 24, the circuit comprising:
a serial data link configured to receive and transmit at least one of correction and scaling factors;
a dual-port buffer coupled to the serial data link and the data structure; and,
a transfer controller coupled to the serial data link, the dual-port buffer, and the data structure and configured to control the transfer of at least one of correction and scaling factors.

28. The amplifier system of claim 24, including a second circuit to calculate correction factors comprising:
- a first multiplier configured to receive a first scale factor associated with the second pair of look-up tables;
- a second multiplier configured to receive a second scale factor associated with the second pair of look-up tables;
- a counter coupled to the data structure and configured to provide a count and address the second set of look-up tables comprising the data structure based on the count;
- a third multiplier coupled to the counter and the first multiplier and configured to square the count;
- a fourth multiplier coupled to the second and third multipliers and configured to square the squared count, raising the count to the fourth power;
- wherein the squared count and the count raised to the fourth power are combined with the first and second multipliers to calculate corrections factors.

29. A circuit for use in a predistorter having first and second pairs of look-up tables, the circuit comprising:
- a subtracter coupled to the first and second pairs of look-up tables and configured to subtract a previous correction factor from the second pair of look-up tables from a current correction factor from the first pair of look-up tables;
- a first delay circuit coupled intermediate the second pair of look-up tables and the subtracter and configured to delay correction factors from the second pair of look up tables;
- a second delay circuit coupled to the subtracter and configured to delay the difference between the current and previous correction factors; and
- a summer coupled to the second delay circuit and the second pair of look-up tables and configured to add the difference between the current and previous correction factors to a subsequent correction factor to arrive at a correction factor that is used to compensate for memory effects in an RF power amplifier.

30. A data structure for use with an RF power amplifier comprising:
- a first look-up table for storing correction factors that correct for amplitude and phase non-linearities in the RF power amplifier;
- a second look-up table for storing correction factors that correct for memory effects in the RF power amplifier;
- the data structure including a circuit configured to receive scaling factors, the circuit further configured to use the received scaling factors and a polynomial to calculate the correction factors within the data structure and populate the look-up tables.

31. The data structure of claim 30, the data structure configured to apply the scaling factors to the polynomial to calculate the correction factors.

32. The data structure of claim 31, the data structure further configured to receive an offset and offset the polynomial to reduce the memory size required by the look-up tables.

33. The data structure of claim 31 further comprising a counter configured to address the look-up tables based on a count.

34. The data structure of claim 31 further comprising a transfer controller coupled to the counter and configured to initiate counting.

35. The data structure of claim 31 further comprising:
- a switch configured to selected between two scaling factors; and,
- a transfer continuer configured to control the switch.

36. The data structure of claim 31, further comprising:
- a counter configured to provide a count; and
- a multiplier coupled to the counter and configured to square the count.

37. The data structure of claim 36 further comprising a second multiplier coupled to the first multiplier and configured to multiply a scale factor by the squared count.

38. The data structure of claim 37 further comprising a summer coupled to the second multiplier and configured to add an offset to the product of the scale factor and the squared count.

39. The data structure of claim 37 further comprising a second multiplier coupled to the first multiplier and configured to square the squared count.

40. The data structure of claim 39 further comprising a third multiplier coupled to the second multiplier and configured to multiply a scale factor by the count to the fourth power.

41. The data structure of claim 39 further comprising a summer coupled to the third multiplier and configured to add an offset to the product of a scale factor and the count to the fourth power.

42. A method of calibrating an amplifier system, the method comprising:
- loading correction factors that correct for amplitude and phase non-linearities in the response of both an RE power amplifier and a modulator into a data structure, including transferring a scaling factor into the data structure and calculating, in the data structure, correction factors that correct for memory effects in the response of an RF power amplifier from the scaling factor and a polynomial.

43. The method of claim 42, wherein the polynomial is of the form $Wx^2+Yx^4$, and W and Y are scaling factors.

44. The method of claim 42, wherein the polynomial is scaled.

45. A method of predistorting a signal applied to an RF power amplifier, the method comprising:
- storing, in a first pair of look-up tables in a data structure, correction factors that correct for non-linearities in the response of both an RF power amplifier and a vector modulator;
- calculating, in the data structure, correction factors that correct for memory effects in the response of the RF power amplifier and storing the correction factors in a second pair of look-up tables;
- receiving an RF input signal using the vector modulator;
- sampling a portion of the RF input signal power;
- selecting correction factors from the data structure based on a portion of the RF input signal; and
- applying the correction factors to the RF input signal using the vector modulator.

46. The method of claim 45, further comprising:
- transferring scaling factors into the data structure; and
- calculating correction factors that correct for memory effects in the response of the RF power amplifier using the scaling factors.

47. The method of claim 46, further comprising applying the difference equation to the memory effects correction factors so that the predistorted signal corrects for both amplitude and phase non-linearities in the RF power amplifier and the modulator and memory effects in the RF power amplifier.

48. The method of claim 46, where the calculation is based on a polynomial.

49. The method of claim 48, wherein the polynomial is of the form $Wx^2+Yx^4$, and W and Y are scaling factors.

50. The method of claim 46, wherein the calculation scales the polynomial.

* * * * *

UNITED STATES PATENT AND TRADEMARK OFFICE
CERTIFICATE OF CORRECTION

PATENT NO.        : 7,023,273 B2                                    Page 1 of 1
APPLICATION NO.   : 10/679873
DATED             : April 4, 2006
INVENTOR(S)       : Robert Everest Johnson et al.

It is certified that error appears in the above-identified patent and that said Letters Patent is hereby corrected as shown below:

In the Claims,

Column 13, line 49, CLAIM 1 reads ". . .first pair of look-un tables. . ." and should read --. . . first pair of look-up tables. . .--.

Column 16, line 43, CLAIM 24 reads ". . .for amplitude and chase non-linearities in. . ." and should read --. . .for amplitude and phase non-linearities in. . .--.

Column 17, lines 44-45, CLAIM 30 reads "a second look-up table for storing correction factors that correct for memory
effects in the RF power amplifier;" and should read --a second look-up table for storing correction factors that correct for memory effects in the RF power amplifier;--.

Column 17, line 67, CLAIM 35 reads ". . .a transfer continuer configured to. . ." and should read --. . .a transfer controller configured to. . .--.

Column 18, line 24, CLAIM 42 reads ". . .response of both an RE power. . ." and should read --. . .response of both an RF power. . .--.

Signed and Sealed this
Tenth Day of February, 2015

Michelle K. Lee
*Deputy Director of the United States Patent and Trademark Office*